US 12,420,875 B2

(12) United States Patent
Hirase et al.

(10) Patent No.: US 12,420,875 B2
(45) Date of Patent: Sep. 23, 2025

(54) WORK VEHICLE

(71) Applicant: KUBOTA CORPORATION, Osaka (JP)

(72) Inventors: Yuji Hirase, Osaka (JP); Sumio Yagyu, Osaka (JP); Kazuto Okazaki, Osaka (JP); Tsunehiro Il, Osaka (JP)

(73) Assignee: KUBOTA CORPORATION, Osaka (JP)

( * ) Notice: Subject to any disclaimer, the term of this patent is extended or adjusted under 35 U.S.C. 154(b) by 260 days.

(21) Appl. No.: 18/129,530

(22) Filed: Mar. 31, 2023

(65) Prior Publication Data

US 2023/0391408 A1 Dec. 7, 2023

(30) Foreign Application Priority Data

Jun. 3, 2022 (JP) ................................. 2022-090763

(51) Int. Cl.
| | | |
|---|---|---|
| *B62D 33/06* | (2006.01) | |
| *B60H 1/00* | (2006.01) | |
| *B60K 11/04* | (2006.01) | |
| *B60L 50/60* | (2019.01) | |
| *B62D 49/06* | (2006.01) | |

(Continued)

(52) U.S. Cl.
CPC ..... *B62D 33/0617* (2013.01); *B60H 1/00278* (2013.01); *B60H 1/00564* (2013.01); *B60K 11/04* (2013.01); *B60L 50/66* (2019.02); *B62D 33/0604* (2013.01); *B62D 49/06* (2013.01); *H02K 9/19* (2013.01); *H05K 7/20927* (2013.01); *B60K 2001/006* (2013.01); *B60L 2200/40* (2013.01)

(58) Field of Classification Search
CPC ............ B62D 33/0617; B62D 33/0604; B62D 49/06; B60L 50/66; B60H 1/00278; B60H 1/00564; B60K 1/02; B60K 11/02; B60K 11/04; B60K 6/40; H02K 9/19; H05K 7/20927; F01P 3/12; F01P 3/20
See application file for complete search history.

(56) References Cited

U.S. PATENT DOCUMENTS 9,045,028 B2 * 6/2015 Ichikawa .................. B60L 1/08
9,482,321 B2 * 11/2016 Park ........................ B60K 6/445
(Continued)

FOREIGN PATENT DOCUMENTS

| JP | 2002-356111 A | 12/2002 |
|---|---|---|
| JP | 2004-168149 A | 6/2004 |

(Continued)

OTHER PUBLICATIONS

European Search Report issued Nov. 8, 2023 in corresponding European family member application No. 23167203.1.
(Continued)

*Primary Examiner* — John D Walters
(74) *Attorney, Agent, or Firm* — GREENBLUM AND BERNSTEIN, P.L.C.

(57) ABSTRACT

A work vehicle includes: a travel device supporting a body; a battery; a motor configured to supply motive power to the travel device; an inverter configured to enable the motor to operate; a cabin supported by the body and housing a driving section that includes a driver seat; and an air conditioner configured to condition air inside the cabin. The inverter is inside the cabin.

20 Claims, 8 Drawing Sheets

(51) Int. Cl.
    *H02K 9/19*     (2006.01)
    *H05K 7/20*     (2006.01)
    *B60K 1/00*     (2006.01)

(56) References Cited

U.S. PATENT DOCUMENTS

| | | | |
|---|---|---|---|
| 10,232,699 B2 * | 3/2019 | Oyama | B60K 6/26 |
| 10,272,774 B2 * | 4/2019 | Hashimoto | B60K 23/08 |
| 10,960,752 B2 * | 3/2021 | Takeno | B60K 1/00 |
| 12,240,289 B2 * | 3/2025 | Eser | B60H 1/00278 |
| 2012/0186391 A1 * | 7/2012 | Boskovitch | B60K 6/46 |
| | | | 180/65.245 |
| 2012/0247846 A1 | 10/2012 | Ichikawa | |

FOREIGN PATENT DOCUMENTS

| | | |
|---|---|---|
| JP | 3 713480 B2 | 11/2005 |
| JP | 2012-210841 A | 11/2012 |
| JP | 2014-65349 A | 4/2014 |
| JP | 2015-218869 A | 12/2015 |
| JP | 2020-093689 A | 6/2020 |

OTHER PUBLICATIONS

Office Action, dated Jun. 3, 2025, in Japanese family member application No. 2022-090763 with English language translation thereof.

\* cited by examiner

WORK VEHICLE

BACKGROUND OF THE INVENTION

1. Field of the Invention

The present invention relates to the configuration of a travel drive system in a work vehicle.

2. Description of the Related Art

As disclosed in JP 2014-65349A, some tractors, which are an example of a work vehicle, include a motor and a battery that supply motive power to a travel device.

SUMMARY OF THE INVENTION

In the case where a tractor is provided with a motor that supplies motive power to the travel device as described above, it is necessary to cool an inverter that operates the motor, and it is also necessary to cool the battery.

An object of the present invention is to provide a simple structure for cooling an inverter and a battery in a work vehicle provided with a motor that supplies motive power to a travel device.

A work vehicle according to an aspect of the present invention includes:
- a travel device supporting a body;
- a battery;
- a motor configured to supply motive power to the travel device;
- an inverter configured to enable the motor to operate;
- a cabin supported by the body and housing a driving section that includes a driver seat; and
- an air conditioner configured to condition air inside the cabin, wherein
- the inverter is inside the cabin.

There is a work vehicle that includes a cabin, which houses a driving section provided with a driver seat, and also an air conditioner for conditioning air inside the cabin. The air conditioner maintains the temperature inside the cabin at a temperature comfortable for the driver, and, particularly in the summer, maintains the temperature inside the cabin at a relatively low and cool temperature.

According to the present invention, the inverter is provided inside the cabin.

Accordingly, in the case where a cooling device for cooling the inverter is provided, the inverter is cooled by the inverter cooling device in a state in which the cooling of the inverter is assisted by the relatively low temperature environment obtained by the air conditioner, and thus the performance required of the inverter cooling device does not need to be increased more than necessary. If the inverter can be sufficiently cooled by the relatively low temperature air obtained by the air conditioner, there is no need to provide a cooling device for the inverter.

According to the present invention, by effectively using the air conditioner, which can be said to be an existing constituent member, it is not necessary to increase the performance required of the cooling device for the inverter more than necessary, and there is no need to provide a cooling device for the inverter, thus making it possible to simplify the structure for cooling the inverter.

According to the present invention, in the case where the temperature of the inverter falls in the winter or the like, if the air conditioner maintains the temperature inside the cabin at a relatively warm temperature, the inverter can also be warmed, which is advantageous in terms of maintaining the performance of the inverter.

In another aspect of the present invention, it is preferable that the work vehicle further includes: a vibration absorber configured to support the cabin to the body and absorb vibration.

In order to improve riding comfort for the driver, there are cases where the work vehicle has a configuration in which the cabin is supported by the machine body via vibration absorbers that absorb vibration.

According to the present invention, the inverter is provided in the cabin that is supported by the body via the vibration absorber that absorbs vibration, and thus vibration of the body during traveling is less likely to be transmitted to the inverter, thus making it possible to suppress failure of the inverter caused by vibration.

In another aspect of the present invention, it is preferable that the inverter is behind a backrest section of the driver seat.

According to the present invention, the space behind the backrest section of the driver seat can be used effectively as space for easily arranging the inverter.

In another aspect of the present invention, it is preferable that the inverter is below a seat section of the driver seat.

According to the present invention, the space below the seat section of the driver seat can be used effectively as space for easily arranging the inverter.

In another aspect of the present invention, it is preferable that the work vehicle further includes: a side panel extending along a front-rear direction on a lateral side of the driver seat, wherein the inverter is below the side panel.

According to the present invention, the space under the side panel provided on one lateral side of the driver seat can be used effectively as space for easily arranging the inverter.

In another aspect of the present invention, it is preferable that the inverter is in a roof section of the cabin.

According to the present invention, the space in the roof section of the cabin can be used effectively as space for easily arranging the inverter.

In another aspect of the present invention, it is preferable that the work vehicle further includes: a strut extending to the roof section in a lateral section of the cabin, wherein air that was conditioned by the air conditioner is supplied to the inverter via a duct inside the strut.

According to the present invention, in the case where the inverter is provided in the roof section of the cabin, air that has been conditioned by the air conditioner is supplied to the inverter via the duct provided inside the strut in the lateral section of the cabin.

Accordingly, by effectively using the strut of the cabin, which can be said to be an existing constituent member, air that has been conditioned by the air conditioner can be easily supplied to the inverter, which is advantageous in terms of simplifying the structure for cooling the inverter.

In another aspect of the present invention, it is preferable that the battery is behind a backrest section of the driver seat.

According to the present invention, the battery is provided inside the cabin.

Accordingly, in the case where a cooling device for cooling the battery is provided, the battery is cooled by the battery cooling device in a state in which the cooling of the battery is assisted by the relatively low temperature environment obtained by the air conditioner, and thus the performance required of the battery cooling device does not need to be increased more than necessary. If the battery can be sufficiently cooled by the relatively low temperature air obtained by the air conditioner, there is no need to provide a cooling device for the battery.

According to the present invention, by effectively using the air conditioner, which can be said to be an existing constituent member, it is not necessary to increase the performance required of the cooling device for the battery more than necessary, and there is no need to provide a cooling device for the battery, thus making it possible to simplify the structure for cooling the battery.

According to the present invention, in the case where the temperature of the battery falls in the winter or the like, if the air conditioner maintains the temperature inside the cabin at a relatively warm temperature, the battery can also be warmed, which is advantageous in terms of maintaining the performance of the battery.

According to the present invention, the battery is provided in the cabin that is supported by the body via the vibration absorber that absorbs vibration, and thus vibration of the body during traveling is less likely to be transmitted to the battery, thus making it possible to suppress failure of the battery caused by vibration.

According to the present invention, the space behind the backrest section of the driver seat can be used effectively as space for easily arranging the battery.

In another aspect of the present invention, it is preferable that the battery is below a seat section of the driver seat.

According to the present invention, the battery is provided inside the cabin.

Accordingly, in the case where a cooling device for cooling the battery is provided, the battery is cooled by the battery cooling device in a state in which the cooling of the battery is assisted by the relatively low temperature environment obtained by the air conditioner, and thus the performance required of the battery cooling device does not need to be increased more than necessary. If the battery can be sufficiently cooled by the relatively low temperature air obtained by the air conditioner, there is no need to provide a cooling device for the battery.

According to the present invention, by effectively using the air conditioner, which can be said to be an existing constituent member, it is not necessary to increase the performance required of the cooling device for the battery more than necessary, and there is no need to provide a cooling device for the battery, thus making it possible to simplify the structure for cooling the battery.

According to the present invention, in the case where the temperature of the battery falls in the winter or the like, if the air conditioner maintains the temperature inside the cabin at a relatively warm temperature, the battery can also be warmed, which is advantageous in terms of maintaining the performance of the battery.

According to the present invention, the battery is provided in the cabin that is supported by the body via the vibration absorber that absorbs vibration, and thus vibration of the body during traveling is less likely to be transmitted to the battery, thus making it possible to suppress failure of the battery caused by vibration.

According to the present invention, the space below the seat section of the driver seat can be used effectively as space for easily arranging the battery.

In another aspect of the present invention, it is preferable that the work vehicle further includes: a side panel extending along a front-rear direction on a lateral side of the driver seat, wherein the battery is below the side panel.

According to the present invention, the battery is provided inside the cabin.

Accordingly, in the case where a cooling device for cooling the battery is provided, the battery is cooled by the battery cooling device in a state in which the cooling of the battery is assisted by the relatively low temperature environment obtained by the air conditioner, and thus the performance required of the battery cooling device does not need to be increased more than necessary. If the battery can be sufficiently cooled by the relatively low temperature air obtained by the air conditioner, there is no need to provide a cooling device for the battery.

According to the present invention, by effectively using the air conditioner, which can be said to be an existing constituent member, it is not necessary to increase the performance required of the cooling device for the battery more than necessary, and there is no need to provide a cooling device for the battery, thus making it possible to simplify the structure for cooling the battery.

According to the present invention, in the case where the temperature of the battery falls in the winter or the like, if the air conditioner maintains the temperature inside the cabin at a relatively warm temperature, the battery can also be warmed, which is advantageous in terms of maintaining the performance of the battery.

According to the present invention, the battery is provided in the cabin that is supported by the body via the vibration absorber that absorbs vibration, and thus vibration of the body during traveling is less likely to be transmitted to the battery, thus making it possible to suppress failure of the battery caused by vibration.

According to the present invention, the space under the side panel provided on one lateral side of the driver seat can be used effectively as space for easily arranging the battery.

In another aspect of the present invention, it is preferable that the battery is in a roof section of the cabin.

According to the present invention, the battery is provided inside the cabin.

Accordingly, in the case where a cooling device for cooling the battery is provided, the battery is cooled by the battery cooling device in a state in which the cooling of the battery is assisted by the relatively low temperature environment obtained by the air conditioner, and thus the performance required of the battery cooling device does not need to be increased more than necessary. If the battery can be sufficiently cooled by the relatively low temperature air obtained by the air conditioner, there is no need to provide a cooling device for the battery.

According to the present invention, by effectively using the air conditioner, which can be said to be an existing constituent member, it is not necessary to increase the performance required of the cooling device for the battery more than necessary, and there is no need to provide a cooling device for the battery, thus making it possible to simplify the structure for cooling the battery.

According to the present invention, in the case where the temperature of the battery falls in the winter or the like, if the air conditioner maintains the temperature inside the cabin at a relatively warm temperature, the battery can also be warmed, which is advantageous in terms of maintaining the performance of the battery.

According to the present invention, the battery is provided in the cabin that is supported by the body via the vibration absorber that absorbs vibration, and thus vibration of the body during traveling is less likely to be transmitted to the battery, thus making it possible to suppress failure of the battery caused by vibration.

According to the present invention, the space in the roof section of the cabin can be used effectively as space for easily arranging the battery.

In another aspect of the present invention, it is preferable that the work vehicle further includes: a strut extending to the roof section in a lateral section of the cabin, wherein air that was conditioned by the air conditioner is supplied to the battery via a duct inside the strut.

According to the present invention, in the case where the battery is provided in the roof section of the cabin, air that has been conditioned by the air conditioner is supplied to the battery via the duct provided inside the strut in the lateral section of the cabin.

Accordingly, by effectively using the strut of the cabin, which can be said to be an existing constituent member, air that has been conditioned by the air conditioner can be easily supplied to the battery, which is advantageous in terms of simplifying the structure for cooling the battery.

In another aspect of the present invention, it is preferable that the air conditioner is in a roof section of the cabin, the work vehicle further includes a strut extending to the roof section in a lateral section of the cabin, and air that was conditioned by the air conditioner is supplied to the inverter via a duct inside the strut.

According to the present invention, in the case where the air conditioner is provided in the roof section of the cabin, air that has been conditioned by the air conditioner is supplied to the inverter via the duct provided inside the strut in the lateral section of the cabin.

Accordingly, by effectively using the strut of the cabin, which can be said to be an existing constituent member, air that has been conditioned by the air conditioner can be easily supplied to the inverter, which is advantageous in terms of simplifying the structure for cooling the inverter.

In another aspect of the present invention, it is preferable that the air conditioner is in a roof section of the cabin, the work vehicle further includes a strut extending to the roof section in a lateral section of the cabin, and air that was conditioned by the air conditioner is supplied to the battery via a duct inside the strut.

According to the present invention, in the case where the air conditioner is provided in the roof section of the cabin, air that has been conditioned by the air conditioner is supplied to the battery via the duct provided inside the strut in the lateral section of the cabin.

Accordingly, by effectively using the strut of the cabin, which can be said to be an existing constituent member, air that has been conditioned by the air conditioner can be easily supplied to the battery, which is advantageous in terms of simplifying the structure for cooling the battery.

In another aspect of the present invention, it is preferable that the air conditioner is behind a backrest section of the driver seat.

According to the present invention, the space behind the backrest section of the driver seat can be used effectively as space for easily arranging the air conditioner.

In another aspect of the present invention, it is preferable that the air conditioner is below a seat section of the driver seat.

According to the present invention, the space below the seat section of the driver seat can be used effectively as space for easily arranging the air conditioner.

In another aspect of the present invention, it is preferable that the work vehicle further includes: a side panel extending along a front-rear direction on a lateral side of the driver seat, wherein the air conditioner is below the side panel.

According to the present invention, the space under the side panel provided on one lateral side of the driver seat can be used effectively as space for easily arranging the air conditioner.

In another aspect of the present invention, it is preferable that the work vehicle further includes: a first storage section configured to store cooling oil; a second storage section configured to store cooling water; a first pump; and a second pump, wherein the cooling oil in the first storage section is supplied to the motor by the first pump, and returns from the motor to the first storage section, and the cooling water in the second storage section is supplied to the inverter by the second pump, and returns from the inverter to the second storage section.

The motor that supplies motive power to the travel device is generally more likely to reach a high temperate than the inverter due to being subjected to the load of traveling, and thus a relatively large difference arises between the temperatures of the motor and the inverter.

According to the present invention, the first storage section stores cooling oil, the second storage section stores cooling water, the cooling oil in the first storage section is supplied to the motor by the first pump and returns to the first storage section, and the cooling water in the second storage section is supplied to the inverter by the second pump and returns to the second storage section.

According to the present invention, the cooling oil for cooling the motor and the cooling water for cooling the inverter are provided separately, thus making it possible to use cooling oil that is preferable for the motor that reaches a relatively high temperature, and making it possible to use cooling water that is preferable for the inverter that remains at a lower temperature than the motor.

Accordingly, the motor (cooling oil) and the inverter (cooling water) do not affect each other, and the cooling of the motor and the cooling of the inverter can both be performed efficiently.

According to the present invention, it is possible to use cooling oil which is preferable for the motor that reaches a relatively high temperature, and it is possible to use cooling water which is preferable for the inverter that remains at a lower temperature than the motor, and this is advantageous in that the cooling of the motor and the cooling of the inverter can both be performed efficiently.

In another aspect of the present invention, it is preferable that the work vehicle further includes: a cooling section configured to cool the cooling oil in a first supply system in which the cooling oil in the first storage section is supplied from the first pump to the motor; and a radiator configured to cool the cooling water in a second supply system in which the cooling water in the second storage section is supplied from the second pump to the inverter.

According to the present invention, the cooling oil is cooled by the cooling section, and the cooled cooling oil is supplied to the motor, which is advantageous in terms of cooling the motor.

According to the present invention, the cooling water is cooled by the radiator, and the cooled cooling water is supplied to the inverter, which is advantageous in terms of cooling the inverter.

In another aspect of the present invention, it is preferable that the cooling section includes a heat exchanger extending across the first supply system and the second supply system, and the heat exchanger is configured to perform heat exchange between the cooling oil and the cooling water.

According to the present invention, in the heat exchanger, heat is exchanged between the cooling oil of the first supply system and the cooling water of the second supply system, heat of cooling oil in the first supply system is absorbed by cooling water in the second supply system, thus lowering the temperature of the cooling oil in the first supply system (or heat of cooling water in the second supply system is absorbed by cooling oil in the first supply system, thus lowering the temperature of the cooling water in the second supply system), and this is advantageous in that the cooling of the motor and the cooling of the inverter can both be performed efficiently.

In the case where an oil cooler for cooling the cooling oil is provided separately from the heat exchanger, if the heat exchanger performs heat exchange between the cooling oil in the first supply system and the cooling water in the second supply system, the load applied to the oil cooler can be reduced, thus making it possible to reduce the size of the oil cooler.

If the cooling oil can be sufficiently cooled by heat exchange between the cooling oil in the first supply system and the cooling water in the second supply system performed by the heat exchanger, an oil cooler for cooling oil does not need to be provided.

In another aspect of the present invention, it is preferable that the cooling section includes an oil cooler configured to cool the cooling oil.

According to the present invention, the cooling oil is directly cooled by the oil cooler, and the cooled cooling oil is supplied to the motor, which is advantageous in terms of cooling the motor.

In another aspect of the present invention, it is preferable that the cooling water in the second storage section is supplied to the inverter and the battery by the second pump, and returns from the inverter and the battery to the second storage section.

According to the present invention, the cooling water from the second pump is used not only for cooling the inverter but also for cooling the battery, which is advantageous in terms of simplifying the structure of the cooling system for the inverter and the battery.

DETAILED DESCRIPTION OF PREFERRED EMBODIMENTS

FIGS. 1 to 8 show a tractor, which is an example of a work vehicle. In FIGS. 1 to 8, F indicates the forward direction, B indicates the rearward direction, U indicates the upward direction, D indicates the downward direction, R indicates the right direction, and L indicates the left direction.

Overall Configuration of Tractor

Figure 1:
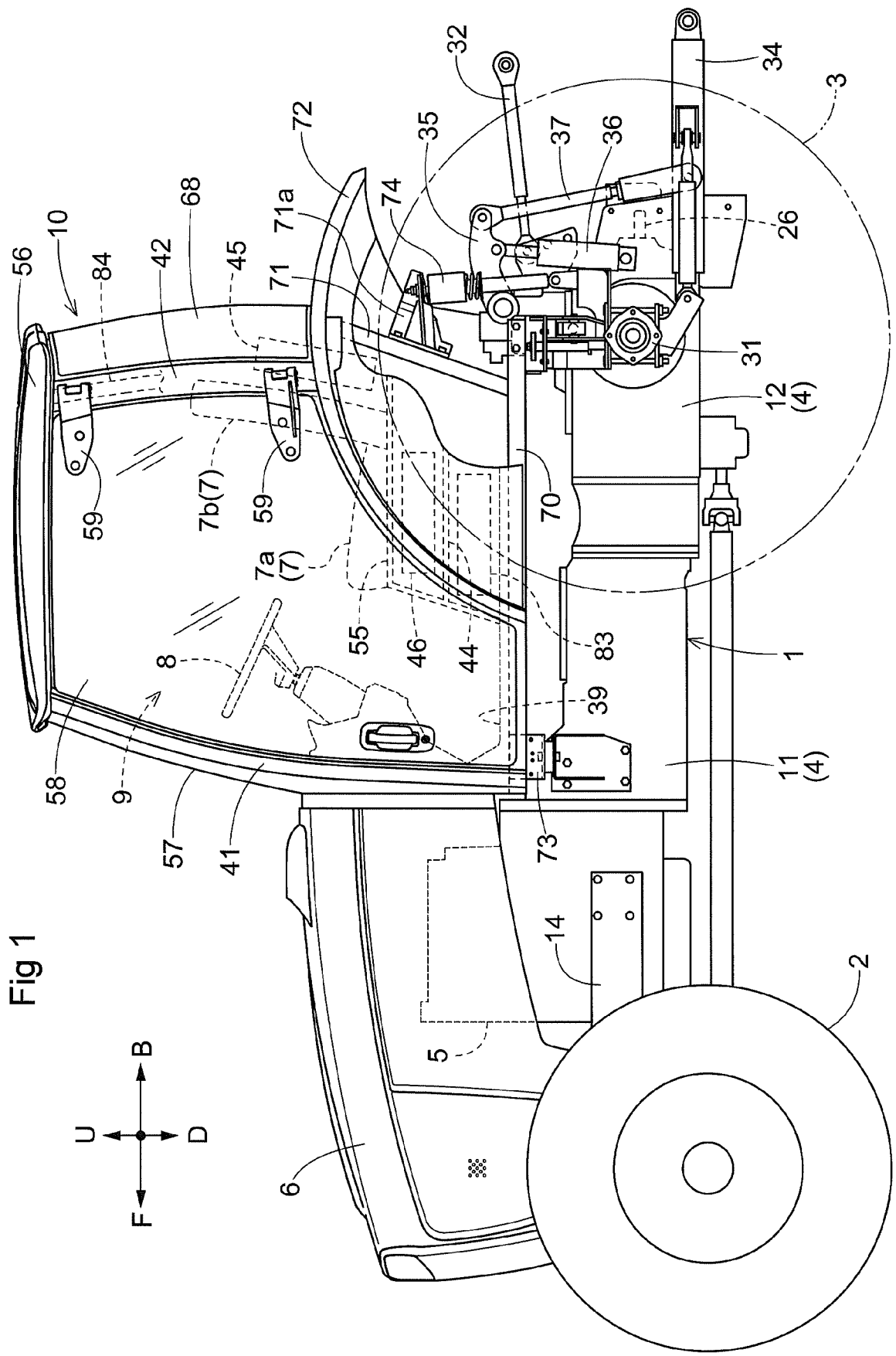
FIG. 1 is a left side view of a tractor.

As shown in FIG. 1, a body 1 is supported by right and left front wheels 2 (corresponding to travel devices) and right and left rear wheels 3 (corresponding to travel devices), a bonnet 6 is provided in a front section of the body 1, and a driving section 9 is provided in a rear section of the body 1.

The body 1 includes an engine 5, a clutch housing 11 (corresponding to a first storage section) coupled to a rear section of the engine 5, a transmission case 12 coupled to a rear section of the clutch housing 11, a front frame 14 coupled to a front section of the engine 5, and the like. A hybrid transmission 4 is configured by provision of the clutch housing 11 and the transmission case 12.

The engine 5 is covered by the bonnet 6. The driving section 9 is covered by and housed in a cabin 10 supported by the body 1.

The front wheels 2 are supported by the front frame 14. Right and left rear axle cases 31 are coupled to a rear section of the transmission case 12 (body 1) and extend laterally outward to the right and left from the rear section of the transmission case 12 (body 1), and the rear wheels 3 are supported by the rear axle cases 31.

Configuration for Supporting Work Device

As shown in FIG. 1, one top link 32 and right and left lower links 34 extend rearward from a rear section of the transmission case 12 and can swing in the up-down direction. A work device such as a rotary tillage device (not shown) or a plow device (not shown) is connected to and supported by the top link 32 and the lower links 34. A PTO shaft 26 is provided at a rear section of the transmission case 12, and motive power is transmitted from the PTO shaft 26 to the work device via a transmission shaft (not shown).

Right and left lift arms 35 are provided above a rear section of the transmission case 12 and can swing in the up-down down. Right and left lifting cylinders 36 extend between a rear section of the transmission case 12 and the corresponding lift arms 35. Linking rods 37 extend between the lift arms 35 and the lower links 34, and when the lift arms 35 are raised or lowered by the lifting cylinders 36, the lower links 34 are correspondingly raised or lowered, and the work device is thus raised or lowered.

Configuration of Clutch Housing

Figure 3:
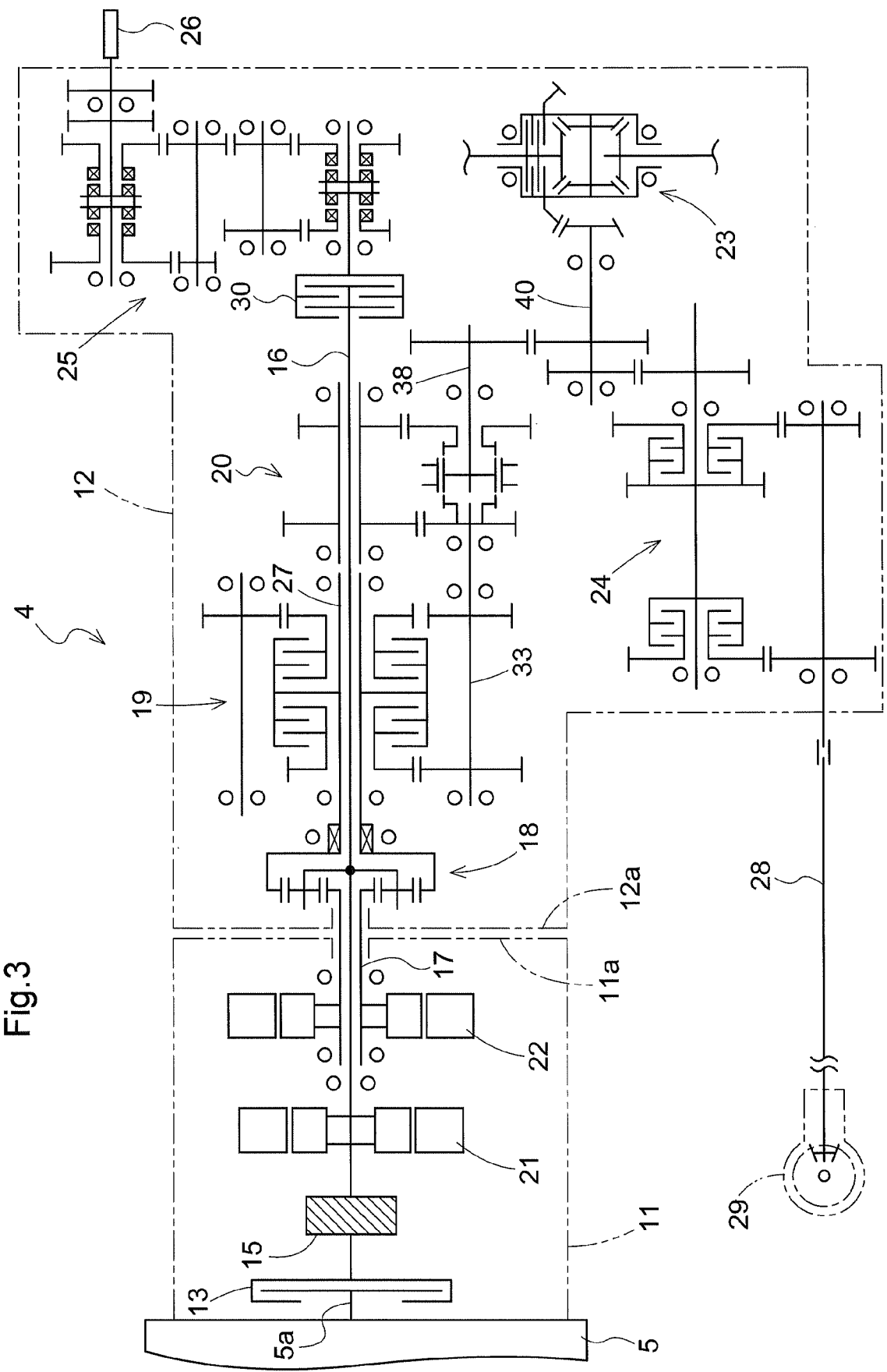
FIG. 3 is a schematic diagram showing the inside of a hybrid transmission.

As shown in FIG. 3, a clutch 13, a hydraulic pump 15, a first motor generator 21 (corresponding to a motor), and a second motor generator 22 (corresponding to a motor) are provided inside the clutch housing 11.

The clutch 13 is connected to an output shaft 5a of the engine 5, and a transmission shaft 16 is connected to the clutch 13 and extends from the inside of the clutch housing 11 to a rear section of the inside of the transmission case 12. A cylindrical shaft 17 is rotatably attached to the transmission shaft 16 and extends from the inside of the clutch housing 11 to a front section of the inside of the transmission case 12. The hydraulic pump 15 and the first motor generator 21 are attached to the transmission shaft 16, and the second motor generator 22 is attached to the cylindrical shaft 17.

Transmission System in Transmission Case

As shown in FIG. 3, a planetary device 18, a forward/reverse switching device 19, an auxiliary transmission 20, a rear wheel differential device 23, a front wheel transmission 24, a PTO clutch 30, a PTO transmission 25, and a PTO shaft 26 are provided inside the transmission case 12.

Motive power generated by the engine 5 (or motive power generated by the first motor generator 21) is transmitted via the transmission shaft 16 and the PTO clutch 30 to the PTO transmission device 25 and accelerated or decelerated therein, and then transmitted to the PTO shaft 26.

The inside of the clutch housing 11 and the inside of the transmission case 12 are partitioned by a rear wall portion 11a of the clutch housing 11 and a front wall portion 12a of the transmission case 12. The transmission shaft 16 and the cylindrical shaft 17 pass through the wall portion 11a of the clutch housing 11 and the wall portion 12a of the transmission case 12.

The cylindrical shaft 27 is rotatably attached to the transmission shaft 16. The planetary device 18 includes a sun gear, a plurality of planetary gears, a carrier, a ring gear, and the like.

Motive power generated by the engine 5 (or motive power generated by the first motor generator 21) and motive power generated by the second motor generator 22 are combined and accelerated or decelerated in the planetary device 18, and the resulting motive power is transmitted from the planetary device 18 to the cylindrical shaft 27.

The forward/reverse switching device 19 includes a forward clutch, a reverse clutch, and the like. In the forward/reverse switching device 19, when the forward clutch is operated to the transmission state, motive power is transmitted from the cylindrical shaft 27 to the transmission shaft 33 in a forward state. When the reverse clutch is operated to the transmission state, motive power is transmitted from the cylindrical shaft 27 to the transmission shaft 33 in a reverse state.

The auxiliary transmission 20 is configured to be capable of shifting between high speed and low speed, and motive power changed to a high speed state or a low speed state is transmitted to the transmission shaft 38. Motive power transmitted to the transmission shaft 38 is transmitted from the rear wheel output shaft 40 to the rear wheel differential device 23 and from the rear wheel differential device 23 to the rear wheels 3.

The front wheel transmission 24 includes a standard clutch, a speed increasing clutch, and the like, and motive power extracted from a point just before the rear wheel differential device 23 is transmitted to the front wheel transmission 24.

When the front wheels 2 are steered from the straight ahead position to angles less than or equal to right and left set angles, the standard clutch is operated to the transmission state, and the front wheels 2 and the rear wheels 3 are driven at the same speed. When the front wheels 2 are steered to the left or right beyond the right and left set angles, the speed increasing clutch is operated to the transmission state, and the front wheels 2 are driven at a higher speed than the rear wheels 3.

Configurations Related to First Motor Generator and Second Motor Generator

Figure 4:
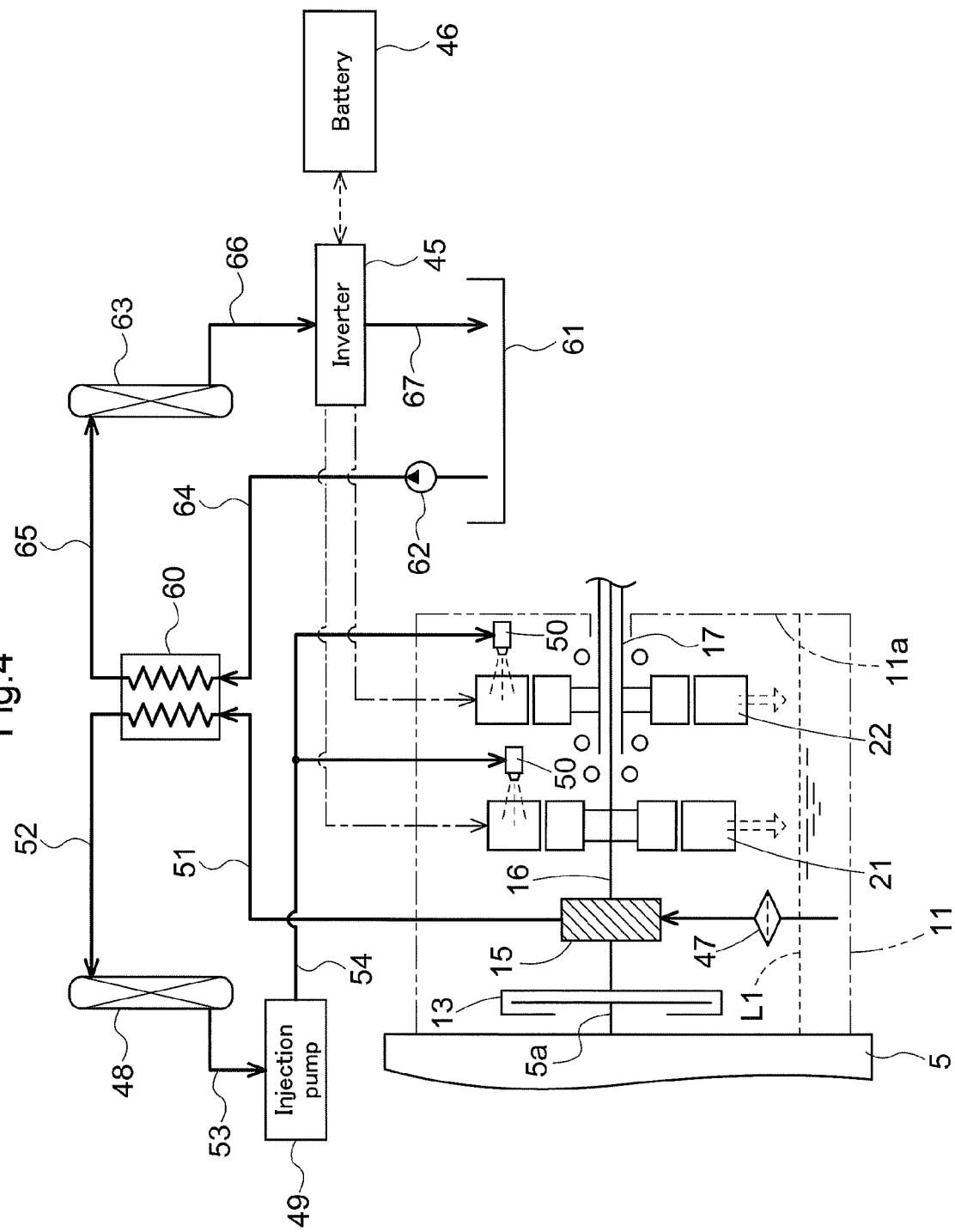
FIG. 4 is a schematic diagram showing an overview of cooling and lubrication of a first motor generator and a second motor generator, and an overview of inverter cooling.

As shown in FIGS. 3 and 4, an inverter 45 and a battery 46 are provided for the first motor generator 21 and the second motor generator 22.

In the case where the first motor generator 21 (second motor generator 22) operates as a motor and gives motive power to the transmission shaft 16 (cylindrical shaft 17), DC power generated by the battery 46 is converted into AC power by the inverter 45, which is supplied to the first motor generator 21 (second motor generator 22), and thus the first motor generator 21 (second motor generator 22) operates as a motor (driving mode).

In the case where the first motor generator 21 (second motor generator 22) is driven and operates as a generator, AC power generated by the first motor generator 21 (second motor generator 22) is converted into DC power by the inverter 45, and the battery 46 is charged with the DC power (charging mode).

A control device (not shown) sets the first motor generator 21 to the charging mode or the driving mode and sets the second motor generator 22 to the charging mode or the driving mode based on the state of the work device (not shown) mounted to the machine body 1, the traveling state of the body 1, and the like.

In this case, the state in which the first motor generator 21 is set to the charging mode and the second motor generator 22 is set to the driving mode is the basic traveling state.

In the basic traveling state, motive power generated by the engine 5 is transmitted to the carrier of the planetary device 18, motive power generated by the second motor generator 22 is transmitted to the sun gear of the planetary device 18, and, in the planetary device 18, the motive power from the engine 5 and the motive power from the second motor generator 22 are combined and accelerated or decelerated, and the resulting motive power is transmitted from the ring gear of the planetary device 18 to the cylindrical shaft 27.

If the clutch 13 is operated to the disengaged state, the engine 5 can be stopped and the body can travel with the first motor generator 21 and the second motor generator 22 in the driving mode.

Configuration of Cabin

Figure 2:
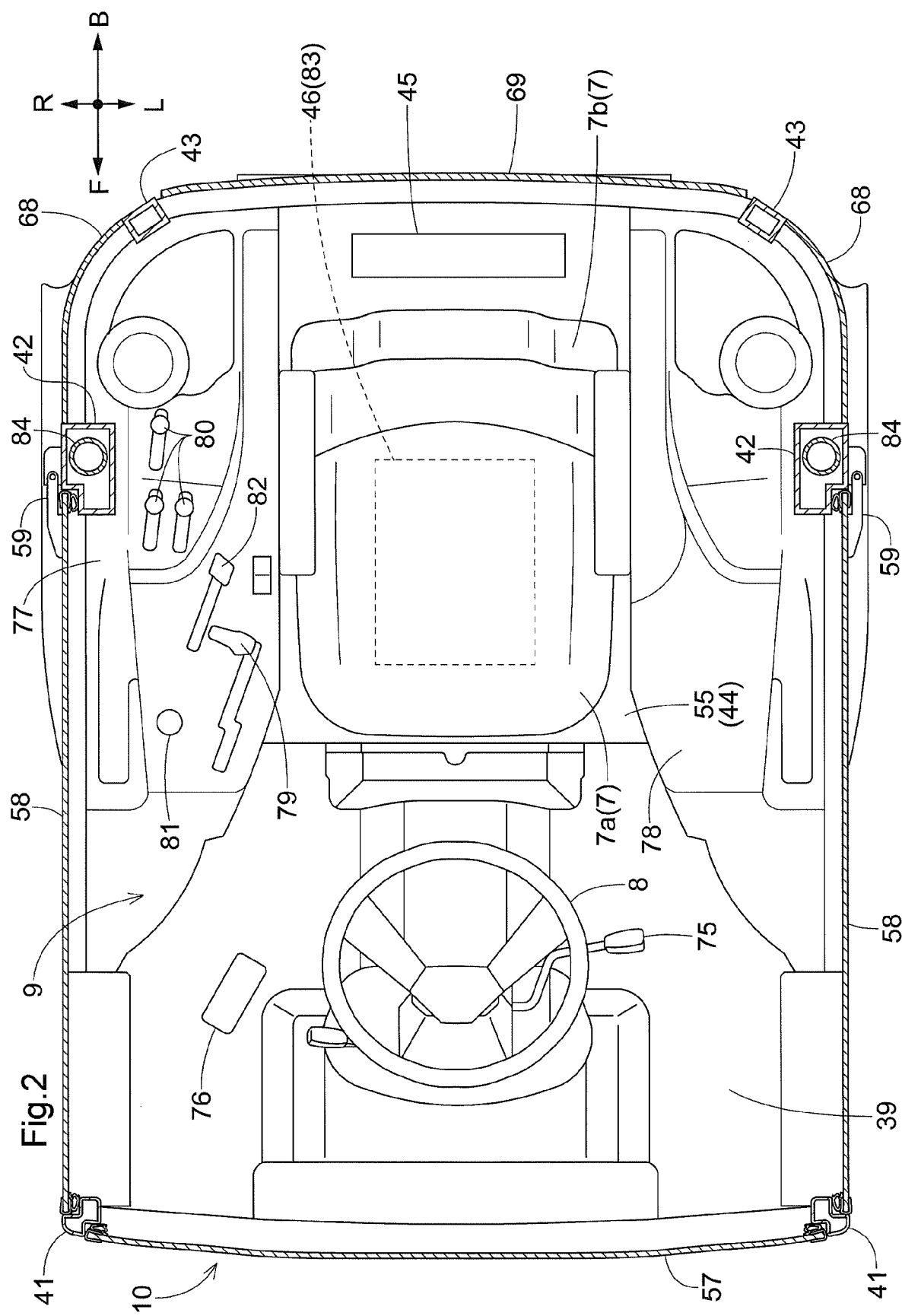
FIG. 2 is a cross-sectional plan view of a cabin.

As shown in FIGS. 1 and 2, the cabin 10 includes a front floor section 39, a rear floor section 44, right and left first struts 41, right and left second struts 42 (corresponding to struts), right and left third struts 43, a windshield 57, right and left doors 58, right and left rear windows 68, a rear hatch window 69, a roof section 56, and the like, and the inside of the cabin 10 constitutes the driving section 9.

The front floor section 39 is arranged at a relatively low position. The rear floor section 44 is arranged at a position higher than the front floor section 39, and a support plate 55 is arranged above the rear floor section 44 with a space therebetween.

The first struts 41 extend upward from right and left front sections of the front floor section 39, and the second struts 42 and the third struts 43 extend upward from right and left rear sections of the rear floor section 44 and the support plate 55.

The roof section 56 is attached to upper sections of the first struts 41, the second struts 42, and the third struts 43. The roof section 56 is manufactured by blow molding, and the roof section 56 has a hollow interior.

According to the above configuration, the second struts 42 (struts) are provided in lateral sections of the cabin 10 and extend to the roof section 56.

The windshield 57 is mounted between the right and left first struts 41. The right and left doors 58 are made of transparent hard glass, and are attached to the second struts 42 with use of hinge members 59 so as to be capable of opening and closing. The right and left rear windows 68 are mounted between the second struts 42 and the third struts 43. The rear hatch window 69 is mounted to the right and left third struts 43 so as to be capable of opening and closing by the upper section swinging around an axis (not shown) extending in the left-right direction.

Right and left frames 70 are coupled to lower right and left sections of the cabin 10 and extend along the front-rear direction, right and left frames 71 are coupled to the frames 70, and right and left fenders 72 are coupled to the frames 70 and 71.

Front sections of the right and left frames 70 are supported by right and left sections of the clutch housing 11 (body 1) via right and left vibration absorbing rubber members 73 (corresponding to vibration absorbers). Brackets 71a are coupled to the right and left frames 71, and right and left suspension mechanisms 74 (corresponding to vibration absorbers), which include suspension springs and dampers, extend between the rear axle cases 31 (body 1) and the brackets 71a of the frames 71.

According to the above configuration, the work vehicle is provided with the vibration absorbing rubber members 73 (vibration absorbers) and the suspension mechanisms 74 (vibration absorbers) that support the cabin 10 to the body 1 and absorb vibration, and the cabin 10 is supported by the body 1 via the vibration absorbing rubber members 73 (vibration absorbers) and the suspension mechanisms 74 (vibration absorbers).

Configuration of Driving Section

As shown in FIGS. 1 and 2, a steering wheel 8 is provided in a front section of the driving section 9 (cabin 10), and a forward/reverse lever 75 for operating the forward/reverse switching device 19 (see FIG. 3) is provided below the left portion of the steering wheel 8. An accelerator pedal 76 for operating an accelerator section (not shown) of the engine 5 is provided at a right section of the front floor section 39.

A driver seat 7 includes a seat section 7a and a backrest section 7b, and the seat section 7a of the driver seat 7 is attached to the support plate 55.

A right side panel 77 extends in the front-rear direction on the right side of the driver seat 7, and a left side panel 78 extends in the front-rear direction on the left side of the driver seat 7.

An auxiliary transmission lever 79 for operating the auxiliary transmission 20 (see FIG. 3), a PTO transmission lever 80 for operating the PTO transmission device 25 (see FIG. 3), and a PTO switch 81 for operating the PTO clutch 30 (see FIG. 3) are provided on the right side panel 77. A lifting lever 82 for operating a control valve (not shown) that controls the supply and discharge of hydraulic oil to and from the lifting cylinder 36 is also provided on the right side panel 77.

Clutch Housing Lubricating Oil and Transmission Case Lubricating Oil

As shown in FIG. 4, lubricating oil (corresponding to cooling oil) having a relatively low viscosity is stored in the bottom section of the clutch housing 11. The amount of lubricating oil is set such that an oil level L1 of the lubricating oil stored in the clutch housing 11 is low enough to not come into contact with the first motor generator 21 and the second motor generator 22.

As shown in FIG. 3, lubricating oil having a higher viscosity than the lubricating oil in the clutch housing 11 is stored in the transmission case 12. The amount of lubricating oil stored in the transmission case 12 is set such that the oil level thereof is higher than the oil level L1 of the lubricating oil in the clutch housing 11, and the transmission case 12 is in an oil-bath state.

The lubricating oil stored in the clutch housing 11 (the lubricating oil for cooling the first motor generator 21 and the second motor generator 22) and the lubricating oil stored in the transmission case 12 are set as different lubricating oils.

The inside of the clutch housing 11 and the inside of the transmission case 12 are partitioned by the rear wall portion 11a of the clutch housing 11 and the front wall portion 12a of the transmission case 12. This prevents the mixing of the lubricating oil stored in the clutch housing 11 (the lubricating oil for cooling the first motor generator 21 and the second motor generator 22) and the lubricating oil stored in the transmission case 12.

Configuration Related to Cooling and Lubrication of First Motor Generator and Second Motor Generator As shown in FIG. 4, the hydraulic pump 15 (corresponding to a first pump), an oil cooler 48 (corresponding to a cooling section), an injection pump 49, and injection nozzles 50 are provided for the first motor generator 21 and the second motor generator 22. A heat exchanger 60 (corresponding to a cooling section) is provided for the first motor generator 21, the second motor generator 22, and the inverter 45.

The hydraulic pump 15 is driven by the transmission shaft 16, and lubricating oil in the clutch housing 11 is sucked into the hydraulic pump 15 through a relatively fine-mesh filter 47. The lubricating oil sucked into the hydraulic pump 15 is supplied from the hydraulic pump 15 to the heat exchanger 60 via a passage 51 (corresponding to a first supply system), and is then supplied from the heat exchanger 60 to the oil cooler 48 via a passage 52 (corresponding to a first supply system) and cooled.

The lubricating oil cooled by the oil cooler 48 is then supplied to the injection pump 49 via a passage 53 (corresponding to a first supply system). A plurality of injection nozzles 50 are provided inside the clutch housing 11 so as to face various portions of the first motor generator 21 and various portions of the second motor generator 22.

The lubricating oil is then supplied from the injection pump 49 to the injection nozzles 50 via a passage 54. The lubricating oil is then supplied from the injection nozzles 50 to various portions of the first motor generator 21 and various portions of the second motor generator 22 to cool and lubricate the first motor generator 21 and the second motor generator 22.

After cooling and lubricating the first motor generator 21 and the second motor generator 22, the lubricating oil naturally falls from the first motor generator 21 and the second motor generator 22 and returns to the bottom section of the clutch housing 11.

According to the above configuration, lubricating oil (cooling oil) in the clutch housing 11 (first storage section) is supplied by the hydraulic pump 15 (first pump) to the first motor generator 21 (motor) and the second motor generator 22 (motor), and returns from the first motor generator 21 (motor) and the second motor generator 22 (motor) to the clutch housing 11 (first storage section).

The oil cooler 48 (cooling section) that cools the lubricating oil (cooling oil) is provided along the passage 51, 52, or 53 (first supply system) along which the lubricating oil (cooling oil) in the clutch housing 11 (first storage section) is supplied by the hydraulic pump 15 (first pump) to the first motor generator 21 (motor) and the second motor generator 22 (motor).

Configuration Related to Air Conditioner

As shown in FIGS. 1 and 2, an air conditioner 83 is supported under the rear floor section 44 inside the cabin 10 (driving section 9). Right and left ducts 84 extend from the air conditioner 83 and extend through the interiors of the right and left second struts 42 to the roof section 56. A plurality of outlets (not shown) are provided in the lower section of the roof section 56.

According to the above configuration, air that has been conditioned by the air conditioner 83 is supplied to the outlets of the roof section 56 via the ducts 84, and is supplied from the outlets of the roof section 56 to the inside of the cabin 10 (driving section 9), and thus the inside of the cabin 10 (driving section 9) is air-conditioned.

Configuration Related to Cooling of Inverter and Battery

As shown in FIGS. 1 and 2, inside the cabin 10 (driving section 9), the inverter 45 extends along the up-down direction at a position behind the backrest section 7b of the driver seat 7. The battery 46 is provided at a position that is below the seat section 7a of the driver seat 7 (support plate 55) and above the rear floor section 44.

Accordingly, the inverter 45 and the battery 46 are provided inside the cabin 10 (driving section 9), and the inverter 45 and the battery 46 are provided in a relatively low temperature atmosphere obtained by the air conditioner 83. As shown in FIG. 4, a cooling water tank 61 (corresponding to a second storage section), a water pump 62 (corresponding to a second pump), and a radiator 63 are provided for the inverter 45. Cooling water is stored in the cooling water tank 61, and the water pump 62 is driven by motive power generated by the engine 5.

The cooling water in the cooling water tank 61 is suctioned by the water pump 62 and supplied from the water pump 62 through a passage 64 (corresponding to a second supply system) to the heat exchanger 60, and is then supplied from the heat exchanger 60 through a passage 65 (corresponding to a second supply system) to the radiator 63 and cooled.

The cooling water cooled by the radiator 63 is supplied to the inverter 45 via a passage 66 (corresponding to a second supply system) to cool the inverter 45, and the cooling water that cooled the inverter 45 then returns to the cooling water tank 61 via a passage 67.

Lubricating oil in the clutch housing 11 is supplied to the heat exchanger 60 via the hydraulic pump 15 and the passage 51, and cooling water in the cooling water tank 61 is supplied to the heat exchanger 60 via the water pump 62 and the passage 64.

In the heat exchanger 60, heat is exchanged between the lubricating oil from the clutch housing 11 and the cooling water from the cooling water tank 61 (heat of lubricating oil from the clutch housing 11 is absorbed by cooling water from the cooling water tank 61, or heat of cooling water from the cooling water tank 61 is absorbed by lubricating oil from the clutch housing 11).

According to the above configuration, the inverter 45 is cooled by the cooling water from the cooling water tank 61 in the relatively low temperature environment obtained by the air conditioner 83, and the cooling of the inverter 45 is assisted by the relatively low temperature environment obtained by the air conditioner 83. The battery 46 is cooled by relatively low temperature air obtained by the air conditioner 83.

The cooling water in the cooling water tank 61 (second storage section) is supplied to the inverter 45 by the water pump 62 (second pump), and returns from the inverter 45 to the cooling water tank 61 (second storage section).

The radiator 63 is provided to cool the cooling water in the passage 64, or 66 (second supply system) through which the cooling water in the cooling water tank 61 (second storage section) is supplied from the water pump 62 (second pump) to the inverter 45.

The heat exchanger 60 is provided to perform heat exchange between the lubricating oil (cooling oil) and the cooling water along the passage 51, 52, or 53 (first supply system) and the passage 64, 65, or 66 (second supply system).

The cooling section, which includes the oil cooler 48 and the heat exchanger 60, is provided as a configuration for cooling the lubricating oil (cooling oil).

In the case of using a configuration in which the heat exchanger 60 performs heat exchange between lubricating oil from the clutch housing 11 and cooling water from the cooling water tank 61 (a configuration in which heat of the lubricating oil from the clutch housing 11 is absorbed by the cooling water from the cooling water tank 61), the size of the oil cooler 48 can be reduced. If the heat exchange described above can be performed sufficiently, the oil cooler 48 may be omitted.

First Variation

In the configuration shown in FIGS. 1 and 2, the battery 46 may extend along the up-down direction at a position behind the backrest section 7b of the driver seat 7, and the inverter 45 may be provided at a position that is below the seat section 7a of the driver seat 7 (support plate 55) and above the rear floor section 44.

Second Variation

Figure 5:
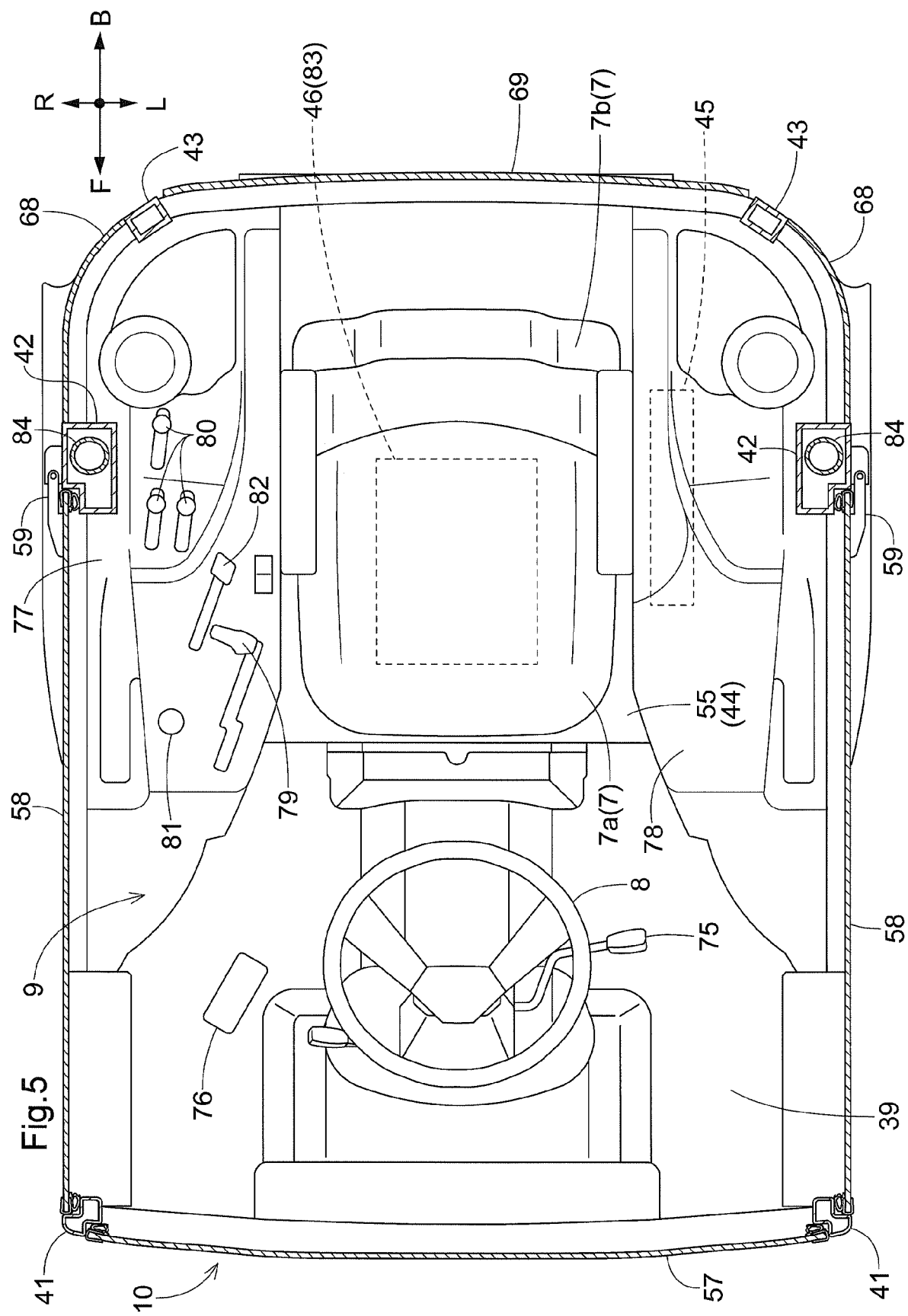
FIG. 5 is a cross-sectional plan view of the cabin according to a second variation of the present invention.

As shown in FIG. 5, the inverter 45 may be provided below the left side panel 78 inside the cabin 10 (driving section 9). Since the auxiliary transmission lever 79 and the like are provided on the right side panel 77, the inverter 45 can be easily provided below the left side panel 78 where the auxiliary transmission lever 79 and the like are not provided.

Even in the case where the auxiliary transmission lever 79 and the like are provided on the right side panel 77, if the inverter 45 can be provided below the right side panel 77, the inverter 45 may be provided below the right side panel 77.

In this case, the battery 46 may be provided at a position that is below the seat section 7a of the driver seat 7 (support plate 55) and above the rear floor section 44, may be provided behind the backrest section 7b of the driver seat 7, or may be provided below the right or left side panel 77 or 78.

Third Variation

In the second variation of the present invention, the battery 46 may be provided below left side panel 78. Since the auxiliary transmission lever 79 and the like are provided on the right side panel 77, the battery 46 can be easily provided below the left side panel 78 where the auxiliary transmission lever 79 and the like are not provided.

Even in the case where the auxiliary transmission lever 79 and the like are provided on the right side panel 77, if the battery 46 can be provided below the right side panel 77, the battery 46 may be provided below the right side panel 77.

In this case, the inverter 45 may be provided at a position that is below the seat section 7a of the driver seat 7 (support plate 55) and above the rear floor section 44, may be provided behind the backrest section 7b of the driver seat 7, or may be provided below the right or left side panel 77 or 78.

Fourth Variation

In the configuration shown in FIGS. 1 to 4 and in the first variation of the present invention, the second variation of the present invention, and the third variation of the present invention, a duct (not shown) separate from the ducts 84 may extend from the air conditioner 83 and be connected to the inverter 45 and the battery 46, and part of the air that has been conditioned by the air conditioner 83 may be supplied directly to the inverter 45 and the battery 46.

Fifth Variation

In the configuration shown in FIGS. 1 to 4 and in the first to fourth variations of the present invention, the air conditioner 83 may extend along the up-down direction behind the backrest section 7b of the driver seat 7, may be provided at a location that is below the seat section 7a of the driver seat 7 (support plate 55) and above the rear floor section 44, may be provided below the left side panel 78, or may be provided below the right side panel 77.

Sixth Variation

Figure 6:
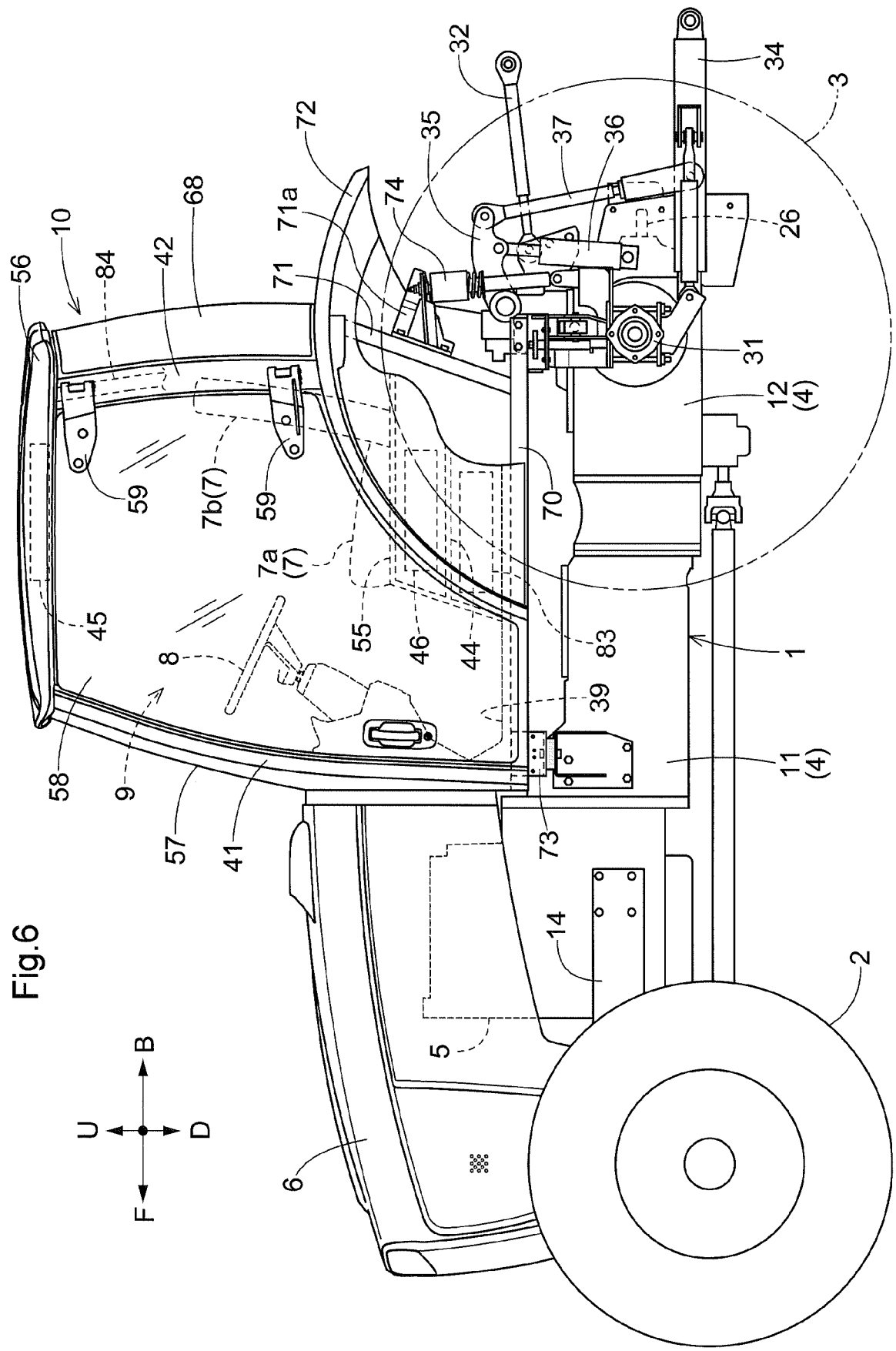
FIG. 6 is a left side view of the tractor according to a sixth variation of the present invention.

As shown in FIG. 6, the inverter 45 may be provided inside the roof section 56 inside the cabin 10 (driving section 9). Since the roof section 56 is hollow and has a relatively large volume, the inverter 45 can be easily provided therein.

Inside the roof section 56, another duct (not shown) may branch from one of the ducts 84, and the other duct may be connected to the inverter 45. Accordingly, air that has been conditioned by the air conditioner 83 is supplied to the outlets of the roof section 56 through the ducts 84, and is directly supplied from one of the ducts 84 to the inverter 45 via the other duct.

In this case, the battery 46 may be provided at a position that is below the seat section 7a of the driver seat 7 (support plate 55) and above the rear floor section 44, may be provided behind the backrest section 7b of the driver seat 7, or may be provided below the right or left side panel 77 or 78.

A configuration is possible in which another duct (not shown) separate from the ducts 84 extends from the air conditioner 83 and is connect to the battery 46, and part of the air that has been conditioned by the air conditioner 83 is directly supplied to the battery 46.

Seventh Variation

In the sixth variation of the present invention, the battery 46 may be provided inside the roof section 56. Since the roof section 56 is hollow and has a relatively large volume, the battery 46 can be easily provided therein.

Inside the roof section 56, another duct (not shown) may branch from one of the ducts 84, and the other duct may be connected to the battery 46. Accordingly, air that has been conditioned by the air conditioner 83 is supplied to the outlets of the roof section 56 through the ducts 84, and is directly supplied from one of the ducts 84 to the battery 46 via the other duct.

In this case, the inverter 45 may be provided at a position that is below the seat section 7a of the driver seat 7 (support plate 55) and above the rear floor section 44, may be provided behind the backrest section 7b of the driver seat 7, or may be provided below the right or left side panel 77 or 78 (see FIG.

A configuration is possible in which another duct (not shown) separate from the ducts 84 extends from the air conditioner 83 and is connect to the inverter 45, and part of the air that has been conditioned by the air conditioner 83 is directly supplied to the inverter 45.

Eighth Variation

Figure 7:
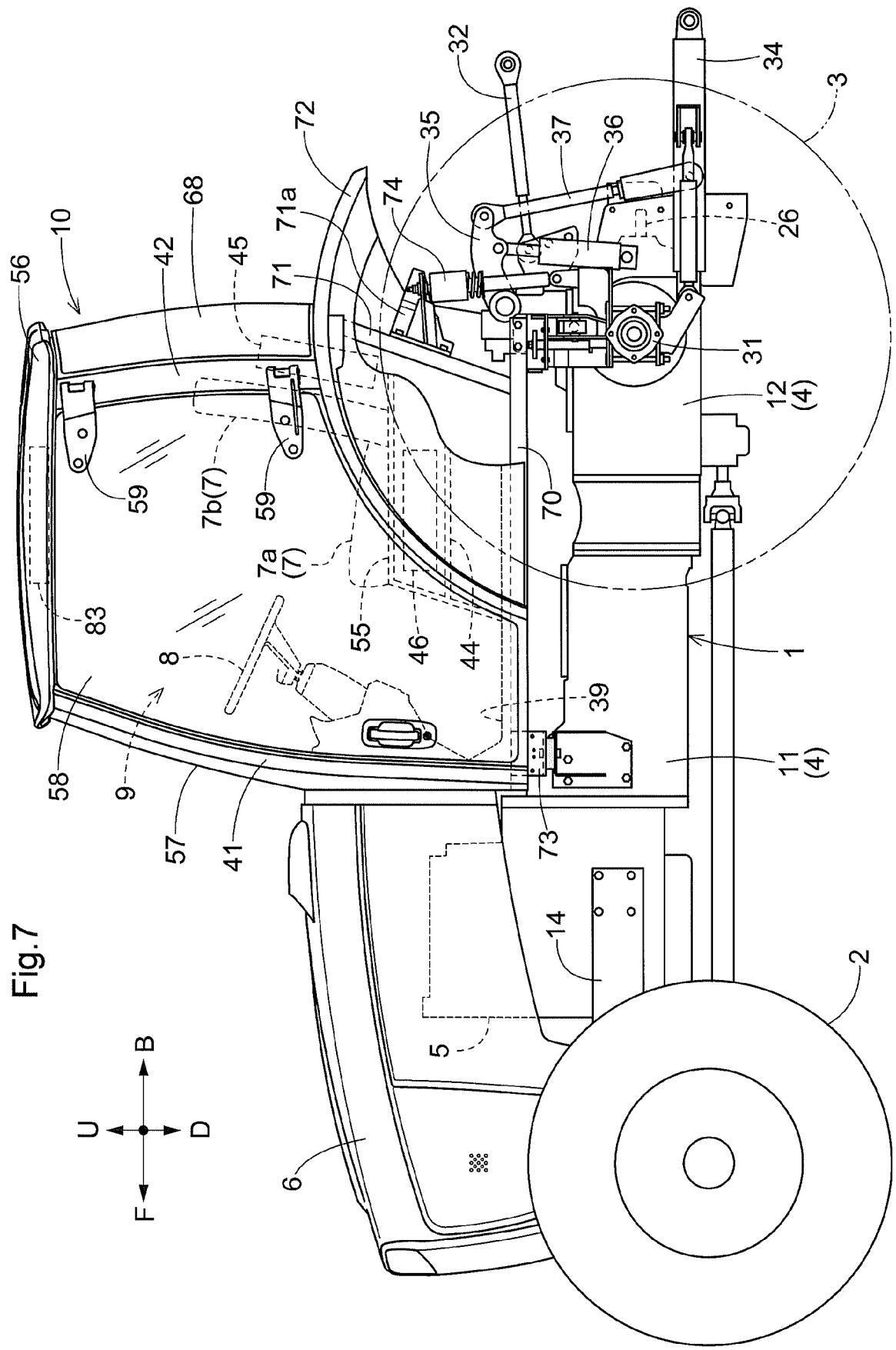
FIG. 7 is a left side view of the tractor according to an eighth variation of the present invention.

As shown in FIG. 7, the air conditioner 83 may be provided inside the roof section 56. According to this configuration, inside the roof section 56, a duct (not shown) extends from the air conditioner 83 and is connected to the outlets of the roof section 56.

In this configuration, the ducts 84 may extend from the air conditioner 83 through the inside of the second struts 42 and be connected to the inverter 45 and the battery 46, and part of the air that has been conditioned by the air conditioner 83 may be directly supplied to the inverter 45 and the battery 46.

Ninth Variation

In the case where the air conditioner 83 is provided inside the roof section 56 as shown in the eighth variation of the present invention, inside the roof section 56, a duct (not shown) extends from the air conditioner 83 and is connected to the outlets of the roof section 56, and the following configurations may also be employed.

Figure 8:
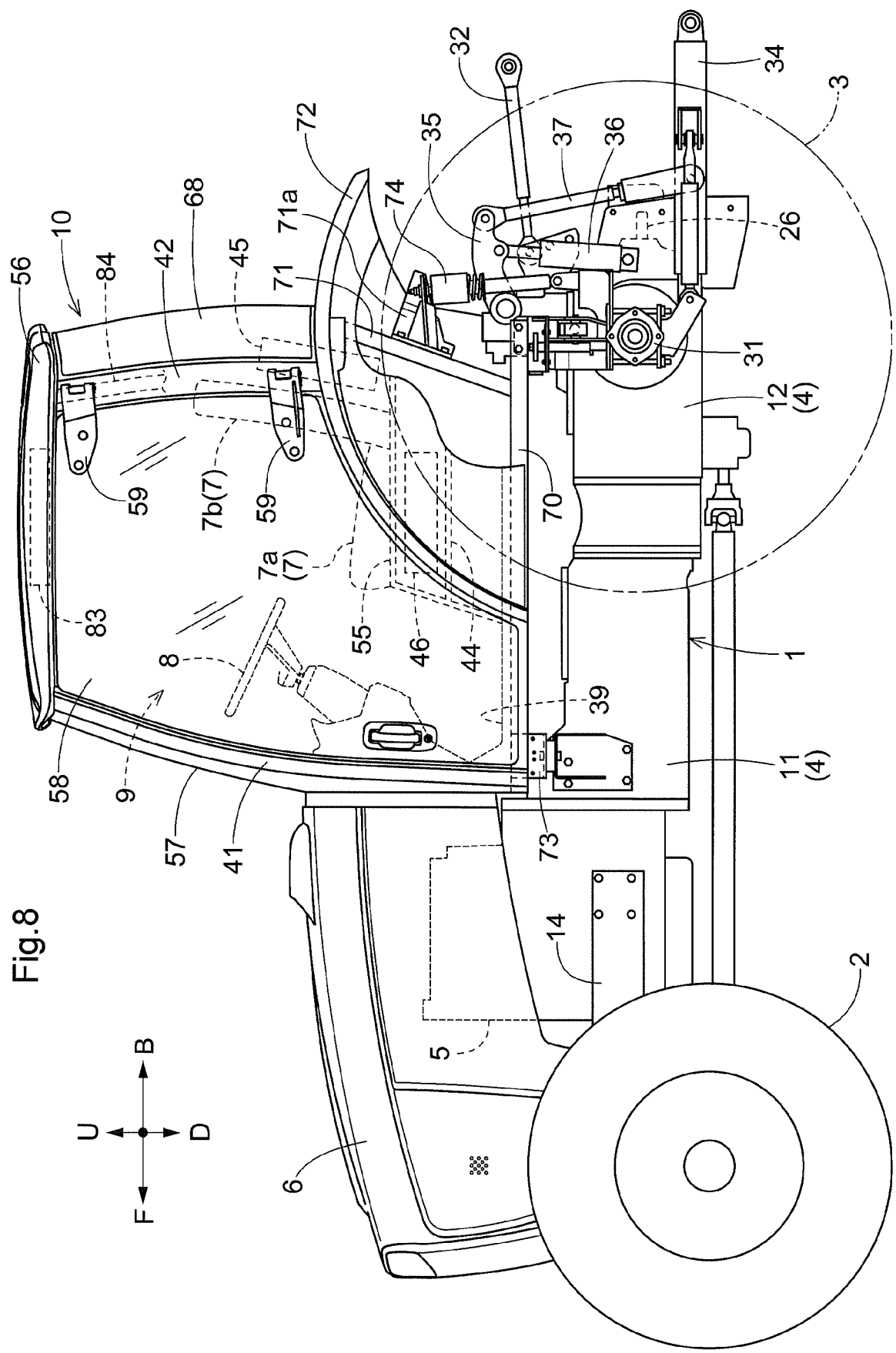
FIG. 8 is a left side view of the tractor according to a ninth variation of the present invention.

As shown in FIG. 8, the right and left ducts 84 extend from the air conditioner 83, extend downward through the right and left second struts 42, and are connected to the inverter 45 and the battery 46. Accordingly, air that has been conditioned by the air conditioner 83 is supplied to the outlets of the roof section 56 and is directly supplied to the inverter 45 and the battery 46 via the ducts 84.

In this case, the inverter 45 may be provided at a position that is below the seat section 7a of the driver seat 7 (support plate 55) and above the rear floor section 44, may be provided behind the backrest section 7b of the driver seat 7, or may be provided below the right or left side panel 77 or 78 (see FIG.

The battery 46 may be provided at a position that is below the seat section 7a of the driver seat 7 (support plate 55) and above the rear floor section 44, may be provided behind the backrest section 7b of the driver seat 7, or may be provided below the right or left side panel 77 or 78 (see FIG. 5).

Tenth Variation

In the sixth to ninth variations of the present invention, if the second struts 42 are narrow and it is difficult to provide the ducts 84 inside the second struts 42, the ducts 84 may extend along the second struts 42. In the present invention, such a case is also referred to as providing the ducts 84 so as to extend through the second struts 42.

Eleventh Variation

Instead of storing lubricating oil in the bottom section of the clutch housing 11, an oil tank (not shown; corresponding to a first storage section) for storing lubricating oil may be provided separately from the clutch housing 11.

Twelfth Variation

The injection pump 49 may be omitted, and lubricating oil may be supplied from the injection nozzles 50 to various portions of the first motor generator 21 and various portions of the second motor generator 22.

Thirteenth Variation

The hydraulic pump 15 and the injection pump 49 may be omitted, and an electric oil pump (not shown; corresponding to a first pump) may be provided along the passage 53 or 54.

According to this configuration, even without providing the injection pump 49, lubricating oil is easily supplied from the injection nozzles 50 to various portions of the first motor generator 21 and various portions of the second motor generator 22.

Fourteenth Variation

The heat exchanger 60 may extend across the passage 53 and the passage 66.

According to this configuration, the heat exchanger 60 is provided between the oil cooler 48 and the injection pump 49, and is also provided between the radiator 63 and the inverter 45.

The heat exchanger 60 may extend across the passage 54 and the passage 67.

According to this configuration, the heat exchanger 60 is provided between the injection pump 49 and the injection nozzle 50, and is provided between the inverter 45 and the cooling water tank 61.

The heat exchanger 60 may extend across the passage 66 and the passage 51 or 52, or may extend across the passage 67 and the passage 51 or 52.

The heat exchanger 60 may extend across the passage 53 and the passage 64 or 65, or may extend across the passage 53 and the passage 67.

The heat exchanger 60 may extend across the passage 54 and the passage 64 or 65, or may extend across the passage 54 and the passage 66.

Fifteenth Variation

In the configuration shown in FIGS. 1 to 4 and in the tenth to thirteenth variations of the present invention, cooling water in the passage 66 may be supplied to not only the inverter 45 but also the battery 46, and be returned from the inverter 45 and the battery 46 to the cooling water tank 61, such that the inverter 45 and the battery 46 are cooled by the cooling water.

Sixteenth Variation

Instead of providing the first motor generator 21 and the second motor generator 22, one motor generator (not shown) may be provided in the clutch housing 11. According to this configuration, the motor generator need only be provided on the transmission shaft 16.

Seventeenth Variation

The work vehicle may be an electric tractor having a configuration in which the engine 5 is omitted, and the first motor generator 21 and the second motor generator 22 are replaced with one or more motors (not shown).

According to this configuration, the planetary device 18 and the forward/reverse switching device 19 do not need to be provided in the transmission case 12.

In the case where a plurality of batteries 46 are provided in the configuration described above, the batteries 46 may be separated into a group of one or more provided inside the cabin 10 (driving section 9) and a group of one or more provided inside the bonnet 6.

A duct (not shown) separate from one of the ducts 84 may extend from the air conditioner 83 and be connected to the battery 46 inside the bonnet 6, and a portion of the air that has been conditioned by the air conditioner 83 may be directly supplied to the battery 46 inside the bonnet 6.

The present invention can be applied not only to a tractor but also to a work vehicle for loading and transporting cargo, a work vehicle for towing a cart or the like, or a work vehicle for construction such as a wheel loader, and can also be applied to a work vehicle equipped with a crawler type of travel device instead of front wheels and rear wheels.

What is claimed is:

1. A work vehicle comprising:
a travel device supporting a body;
a battery;
a motor configured to supply motive power to the travel device;
an inverter configured to enable the motor to operate;
a cabin supported by the body and housing a driving section that includes a driver seat;
a vibration absorber configured to support the cabin to the body and absorb vibration; a strut extending to the roof section in a lateral section of the cabin; and
an air conditioner configured to condition air inside the cabin, wherein
the inverter is inside the cabin, and air that was conditioned by the air conditioner is supplied to the inverter via a duct inside the strut.

2. The work vehicle according to claim 1, wherein the inverter is behind a backrest section of the driver seat.

3. The work vehicle according to claim 1, wherein the inverter is below a seat section of the driver seat.

4. The work vehicle according to claim 1, further comprising:
a side panel extending along a front-rear direction on a lateral side of the driver seat, wherein
the inverter is below the side panel.

5. The work vehicle according claim 1, wherein the battery is behind a backrest section of the driver seat.

6. The work vehicle according to claim 1, wherein the battery is below a seat section of the driver seat.

7. The work vehicle according to claim 1, further comprising:
a side panel extending along a front-rear direction on a lateral side of the driver seat, wherein
the battery is below the side panel.

8. The work vehicle according to claim 1, wherein the battery is in a roof section of the cabin.

9. The work vehicle according to claim 8, further comprising:
a strut extending to the roof section in a lateral section of the cabin, wherein
air that was conditioned by the air conditioner is supplied to the battery via a duct inside the strut.

10. The work vehicle according to claim 1, wherein
the air conditioner is in a roof section of the cabin,
the work vehicle further comprises a strut extending to the roof section in a lateral section of the cabin, and
air that was conditioned by the air conditioner is supplied to the inverter via a duct inside the strut.

11. The work vehicle according to claim 1, wherein
the air conditioner is in a roof section of the cabin,
the work vehicle further comprises a strut extending to the roof section in a lateral section of the cabin, and
air that was conditioned by the air conditioner is supplied to the battery via a duct inside the strut.

12. The work vehicle according to claim 1, wherein the air conditioner is behind a backrest section of the driver seat.

13. The work vehicle according to claim 1, wherein the air conditioner is below a seat section of the driver seat.

14. The work vehicle according to claim 1, further comprising:
a side panel extending along a front-rear direction on a lateral side of the driver seat, wherein
the air conditioner is below the side panel.

15. The work vehicle according to claim 1, further comprising:
a first storage section configured to store cooling oil;
a second storage section configured to store cooling water;
a first pump; and
a second pump, wherein
the cooling oil in the first storage section is supplied to the motor by the first pump, and returns from the motor to the first storage section, and
the cooling water in the second storage section is supplied to the inverter by the second pump, and returns from the inverter to the second storage section.

16. The work vehicle according to claim 15, further comprising:
a cooling section configured to cool the cooling oil in a first supply system in which the cooling oil in the first storage section is supplied from the first pump to the motor; and
a radiator configured to cool the cooling water in a second supply system in which the cooling water in the second storage section is supplied from the second pump to the inverter.

17. The work vehicle according to claim 16, wherein
the cooling section includes a heat exchanger extending across the first supply system and the second supply system, and
the heat exchanger is configured to perform heat exchange between the cooling oil and the cooling water.

18. The work vehicle according to claim 16, wherein
the cooling section includes an oil cooler configured to cool the cooling oil.

19. The work vehicle according to claim 17, wherein
the cooling water in the second storage section is supplied to the inverter and the battery by the second pump, and returns from the inverter and the battery to the second storage section.

20. A work vehicle comprising: a travel device supporting a body; a battery; a motor configured to supply motive power to the travel device; an inverter configured to enable the motor to operate; a cabin supported by the body and housing a driving section that includes a driver seat; an air conditioner configured to condition air inside the cabin; and a vibration absorber configured to support the cabin to the body and absorb vibration, wherein the inverter is inside the cabin, the battery is in a roof section of the cabin, the work vehicle further comprises a strut extending to the roof section in a lateral section of the cabin, and air that was conditioned by the air conditioner is supplied to the battery via a duct inside the strut.

* * * * *